United States Patent
Wang (10) Patent No.: US 9,318,715 B2
(45) Date of Patent: Apr. 19, 2016

(54) HOLE TRANSPORT COMPOSITION WITHOUT LUMINANCE QUENCHING

(71) Applicant: E I DU PONT DE NEMOURS AND COMPANY, Wilmington, DE (US)

(72) Inventor: Ying Wang, West Chester, PA (US)

(73) Assignee: E I DU POINT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/284,089

(22) Filed: May 21, 2014

(65) Prior Publication Data

US 2015/0340629 A1 Nov. 26, 2015

(51) Int. Cl.
| | | |
|---|---|---|
| H01L 29/08 | (2006.01) | |
| H01L 51/00 | (2006.01) | |
| C08F 12/08 | (2006.01) | |
| C09K 11/02 | (2006.01) | |
| C09K 11/06 | (2006.01) | |
| H01L 51/50 | (2006.01) | |

(52) U.S. Cl.
CPC ............ *H01L 51/0085* (2013.01); *C08F 12/08* (2013.01); *C09K 11/025* (2013.01); *C09K 11/06* (2013.01); *H01L 51/50* (2013.01); *H01L 51/5004* (2013.01); *C09K 2211/185* (2013.01); *H01L 51/506* (2013.01); *H01L 2251/308* (2013.01); *H01L 2251/552* (2013.01)

(58) Field of Classification Search
CPC .................................................... H05B 33/00
USPC ............................................ 257/40; 313/506
See application file for complete search history.

(56) References Cited

U.S. PATENT DOCUMENTS

| | | | |
|---|---|---|---|
| 8,084,548 B2* | 12/2011 | Pan et al. ....................... 525/338 |
| 2002/0030441 A1* | 3/2002 | Takematsu et al. ........... 313/504 |
| 2002/0096995 A1* | 7/2002 | Mishima et al. .............. 313/506 |
| 2004/0004433 A1* | 1/2004 | Lamansky et al. ............ 313/506 |
| 2004/0062930 A1* | 4/2004 | Roberts et al. ............. 428/411.1 |
| 2004/0066135 A1* | 4/2004 | Lecloux ................ C07C 211/49 313/503 |
| 2004/0126619 A1* | 7/2004 | Nishita ......................... 428/690 |
| 2005/0014019 A1* | 1/2005 | Wang .................. H01L 51/5048 428/690 |
| 2006/0040139 A1* | 2/2006 | Herron ................... H05B 33/20 428/690 |
| 2006/0134538 A1* | 6/2006 | Radu .................... C07D 311/82 430/58.15 |
| 2006/0149043 A1* | 7/2006 | Kikuchi ............... C07D 215/38 534/15 |
| 2007/0252516 A1* | 11/2007 | Kondakova ......... H01L 51/5016 313/504 |
| 2008/0023671 A1* | 1/2008 | Chichak et al. ........... 252/301.35 |
| 2008/0023672 A1* | 1/2008 | Chichak et al. ........... 252/301.35 |
| 2008/0026249 A1* | 1/2008 | Chichak et al. .............. 428/690 |
| 2008/0026250 A1* | 1/2008 | Chichak et al. .............. 428/690 |
| 2008/0026477 A1* | 1/2008 | Cella et al. ..................... 436/84 |
| 2008/0026496 A1* | 1/2008 | Shiang et al. ................... 438/22 |
| 2008/0027028 A1* | 1/2008 | Chichak ........................ 514/63 |
| 2008/0274303 A1* | 11/2008 | Agata et al. ..................... 428/1.1 |
| 2009/0015139 A1* | 1/2009 | Uetani et al. .................. 313/504 |
| 2009/0309487 A1* | 12/2009 | Royster, Jr. ......... H01L 51/0082 313/504 |
| 2010/0051869 A1* | 3/2010 | Chichak et al. ........... 252/301.16 |
| 2010/0084647 A1* | 4/2010 | Kondakova ......... H01L 51/0058 257/40 |
| 2010/0090586 A1* | 4/2010 | Chichak et al. .............. 313/504 |
| 2010/0244665 A1* | 9/2010 | Herron .................... C07C 13/66 313/504 |
| 2010/0288339 A1* | 11/2010 | Noguchi et al. ............... 136/252 |
| 2011/0256218 A1* | 10/2011 | Venkatesh et al. ............ 424/459 |
| 2011/0269255 A1* | 11/2011 | Goddard et al. ................ 438/46 |
| 2012/0049168 A1* | 3/2012 | Inbasekaran et al. ........... 257/40 |
| 2012/0238774 A1* | 9/2012 | Hayashi et al. ................. 560/86 |

(Continued)

*Primary Examiner* — Caleb Henry (57) ABSTRACT

There is provided a hole transport composition including (a) an inert matrix polymer and (b) at least 10% by weight, based on the total weight of the composition, of a cyclometalated iridium complex.

15 Claims, 3 Drawing Sheets

(56) References Cited

U.S. PATENT DOCUMENTS

| | | | |
|---|---|---|---|
| 2012/0248973 A1* | 10/2012 | Ito et al. | 313/504 |
| 2014/0008642 A1* | 1/2014 | Morita et al. | 257/40 |
| 2014/0151660 A1* | 6/2014 | Kamtekar | C07F 5/025 257/40 |
| 2015/0236278 A1* | 8/2015 | Bryman | H01L 51/0085 257/40 |

* cited by examiner

HOLE TRANSPORT COMPOSITION WITHOUT LUMINANCE QUENCHING

BACKGROUND INFORMATION

1. Field of the Disclosure

The present disclosure relates to novel hole transport compositions and layers made therefrom. The disclosure further relates to electronic devices having at least one novel hole transport layer.

2. Description of the Related Art

In organic electronic devices, such as organic light emitting diodes ("OLED"), that make up OLED displays, an organic active layer is sandwiched between two electrical contact layers. In an OLED the organic layer emits light through the light-transmitting electrical contact layer upon application of a voltage across the electrical contact layers.

It is well known to use organic electroluminescent compounds as the photoactive component in light-emitting diodes. Simple organic molecules, conjugated polymers, and organometallic complexes have been used. Devices that use electroluminescent materials frequently include one or more added electroactive layers, which are positioned between the electroluminescent layer and a contact layer. A hole transport layer can be positioned between the electroluminescent layer and the hole-injecting contact layer. The hole-injecting contact layer may also be called the anode. An electron transport layer can be positioned between the electroluminescent layer and the electron-injecting contact layer. The electron-injecting contact layer may also be called the cathode.

There is a continuing need for hole transport compositions for use in electronic devices.

SUMMARY

There is provided a hole transport composition comprising: (a) an inert matrix polymer and (b) at least 10% by weight, based on the total weight of the composition, of a cyclometalated iridium complex.

There is also provided an electronic device comprising, in order, an anode, a hole transport layer, a photoactive layer, and a cathode, wherein the hole transport layer comprises the above hole transport composition.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a hole transport composition comprising: (a) an inert matrix polymer and (b) at least 10% by weight, based on the total weight of the composition, of a cyclometalated iridium complex.

There is also provided an electronic device comprising, in order, an anode, a hole transport layer, a photoactive layer, and a cathode, wherein the hole transport layer includes the above hole transport composition.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Inert Matrix Polymer, the Iridium Complex, the Hole Transport Composition, the Electronic Device, and finally Examples.

1. Definitions and Clarification of Terms

Before addressing details of embodiments described below, some terms are defined or clarified.

As used herein, the term "alkyl" is intended to mean a group derived from an aliphatic hydrocarbon and includes a linear, a branched, or a cyclic group, which may be unsubstituted or substituted.

The term "aromatic compound" is intended to mean an organic compound comprising at least one unsaturated cyclic group having delocalized pi electrons.

The term "aryl" is intended to mean a group derived from an aromatic hydrocarbon which may be unsubstituted or substituted. The aryl group may be a single ring (monocyclic) or multiple rings (bicyclic, or more) fused together or linked covalently. Any suitable ring position of the aryl moiety may be covalently linked to the defined chemical structure. Examples of aryl moieties include, but are not limited to, phenyl, naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include heteroaryl groups. Heteroaryl groups may have from 4-50 ring carbon atoms; in some embodiments, ring 4-30 carbon atoms.

The "band gap" of a material is intended to mean the difference in energy between the highest occupied molecular orbital ("HOMO") and the lowest unoccupied molecular orbital ("LUMO") for that material. It may be determined experimentally by measuring the absorption spectrum of the material, and the absorption edge taken as the band gap. The band gap is usually in units of eV.

The term "charge-blocking," when referring to a layer, material, member, or structure, is intended to mean such layer, material, member or structure reduces the likelihood that a charge migrates into another layer, material, member or structure. Hole-blocking materials block positive charge; electron-blocking materials block negative charge.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "cyclometalated" as it refers to a metal complex, is intended to mean that the complex contains at least one ligand which bonds to the metal in at least two points, forming at least one ring with at least one carbon-metal bond. In some embodiments, the ring is five- or six-membered.

The term "crosslinkable group" or "crosslinking group" is intended to mean a group than can lead to crosslinking via thermal treatment or exposure to radiation. In some embodiments, the radiation is UV or visible.

The term "dipole moment" is intended to refer to the electric dipole moment of a molecule, and is a measure of the charge distribution within the molecule, without net charge. In the simple case of two point charges, one with charge +q and the other one with charge −q, the electric dipole moment p is:

$$p=qd$$

where d is the displacement vector pointing from the negative charge to the positive charge. The dipole moment is given in debye units, where one debye=$10^{-18}$ statcoulomb·cm. The "local dipole moment" as it refers to a polymer, is intended to mean the electric dipole moment of monomeric units of the polymer.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" as it refers to a layer or a material, is intended to indicate a layer or material which electronically facilitates the operation of the device. Examples of active materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "electron transport," when referring to a layer, material, member, or structure is intended to mean such layer, material, member, or structure facilitates migration of negative charge through the thickness of such layer, material, member, or structure with relative efficiency and small loss of charge. Although light-emitting materials may also have some charge transport properties, the term "electron transport layer, material, member, or structure" is not intended to include a layer, material, member, or structure whose primary function is light emission.

The prefix "fluoro" is intended to indicate that one or more hydrogens in a group has been replaced with fluorine.

The prefix "hetero" indicates that one or more carbon atoms has been replaced with a different atom. In some embodiments, the heteroatom is O, N, S, or combinations thereof.

The term "heterocycle" is intended to mean a compound or group having at least one aromatic ring having a heteroatom in the ring structure.

The term "hole transport," when referring to a layer, material, member, or structure is intended to mean such layer, material, member, or structure facilitates migration of positive charge through the thickness of such layer, material, member, or structure with relative efficiency and small loss of charge. Although light-emitting materials may also have some charge transport properties, the term "hole transport layer, material, member, or structure" is not intended to include a layer, material, member, or structure whose primary function is light emission.

The term "hole mobility" is intended to indicate how quickly a positive charge can migrate through the thickness of a layer when pulled by an electric field. It is specified in units of $cm^2/(V·s)$.

The term "HOMO" refers to the highest occupied molecular orbital. The HOMO energy level is measured relative to vacuum level. By convention, the HOMO is given as a negative value, i.e. the vacuum level is set as zero and the bound electron energy levels are deeper, and more negative, than this. Methods for determining the HOMO energy level are well known and understood. In some embodiments, the level is determined by ultraviolet photoelectron spectroscopy ("UPS"). By "shallower" it is meant that the level is closer to the vacuum level. By "deeper" it is meant that the level is farther removed from the vacuum level.

The term "host material" is intended to mean a matrix material which is used in a photoactive layer with a dopant. The host material may or may not have electronic characteristic(s) or the ability to emit, receive, or filter radiation. The host material is present in larger concentration than the dopant in the photoactive layer.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "LUMO" refers to the lowest unoccupied molecular orbital. The LUMO energy level is measured relative to vacuum level in eV. By convention, the LUMO is a negative value, i.e. the vacuum level is set as zero and the bound electron energy levels are deeper than this. Methods for determining the LUMO energy level are well known and understood. In some embodiments, the level can be determined using inverse photoelectron spectroscopy ("IPES"). By "shallower" it is meant that the level is closer to the vacuum level. By "deeper" it is meant that the level is farther removed from the vacuum level.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "polymer" is intended to mean a material having at least one repeating monomeric unit. The term includes homopolymers having only one kind of monomeric unit, and copolymers having two or more different monomeric units. Copolymers are a subset of polymers. In some embodiments, a polymer has at least 5 repeating units; in some embodiments, at least 10 repeating units; in some embodiments, at least 20 repeating units. In some embodiments, a polymer has a weight average molecular weight greater than 10,000. In some embodiments, a polymer has a weight average molecular weight greater than 50,000. In some embodiments, a polymer has a weight average molecular weight greater than 100,000. Unless otherwise specified, the term "molecular weight" refers to the weight average molecular weight.

The term "silyl" refers to the group $R_3Si$—, where R is H, D, C1-20 alkyl, fluoroalkyl, or aryl. In some embodiments, one or more carbons in an R alkyl group are replaced with Si. In some embodiments, the silyl groups are $(hexyl)_2Si(Me)CH_2CH_2Si(Me)_2$- and $[CF_3(CF_2)_6CH_2CH_2]_2SiMe$-.

The term "siloxane" refers to the group $(RO)_3Si$—, where R is H, D, C1-20 alkyl, or fluoroalkyl.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

Unless otherwise indicated, all groups can be unsubstituted or substituted. In some embodiments, the substituents are selected from the group consisting of deuterium, halide, alkyl, alkoxy, aryl, silyl, and cyano.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC *Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor member arts.

2. Inert Matrix Polymer

The matrix polymer is inert, by which it is meant that it does not have significant hole transport properties. In some embodiments, the hole mobility is lower than $10^{-6}$ cm$^2$/(V·s); in some embodiments, lower than $10^{-8}$ cm$^2$/(V·s). The inert matrix polymer has no amino or carbazolyl groups. As a result, when used alone it will block the transport of holes.

The inert matrix polymer should be film-forming. The molecular weight is not particularly limited. In some embodiments, the weight average molecular weight of the inert matrix polymer is greater than 10,000; in some embodiments, greater than 50,000; in some embodiments, greater than 100,000; in some embodiments, greater than 200,000.

In some embodiments, the inert matrix polymer has a hole mobility less than $10^{-6}$ cm$^2$/(s·V). In some embodiments, the inert matrix polymer has a hole mobility less than $10^{-8}$ cm$^2$/(s·V); in some embodiments less than $10^{-10}$ cm$^2$/(s·V).

In some embodiments, the inert matrix polymer has a band gap greater than 2.8 eV. In some embodiments, the band gap is greater than 2.9 eV; in some embodiments, greater than 3.0 eV. The band gap of polystyrene, as determined by the absorption edge, is around 280-300 nm (4.4-4.1 eV). [Reference: (1) Jiang et al., Polymer Bulletin 25, 211-216 (1991); (2) "Handbook of fluorescence spectra of aromatic molecules", I. B. Berlman, Academic Press, New York, 1965, p. 186.]

In some embodiments, the inert matrix polymer has a first triplet energy greater than 2.6 eV. In some embodiments, the triplet energy is greater than 2.7 eV; in some embodiments, greater than 2.8 eV. The first triplet state of polystyrene is located at 3.2 eV. [Reference: George, G. A. & Hodgeman, D. K. C., *Europ. Polym. J.* 13, 63-71 (1977)]

In some embodiments, the inert matrix polymer has a local dipole moment less than 5 debye. In some embodiments, the inert matrix polymer has a local dipole moment less than 4 debye. In some embodiments, the inert matrix polymer has a local dipole moment less than 3 debye. The methods of measuring dipole moment have been discussed by Paul Bender, Journal of Chemical Education (1946), 23, 179-81.

Examples of suitable inert matrix polymers include, but are not limited to: polystyrenes, polycarbonates, polydienes, polyakylacrylates, polyolefins, polysiloxanes, fluoropolymers, polytetrafluoroethylenes, polyvinylidene fluorides, poly(ethylene glycol), poly(ethylene oxide), their co-polymers, and deuterated analogs thereof.

Any of the preceding inert matrix polymers can be substituted. Examples of suitable substituents include alkyl groups, alkoxy groups, aryl groups, aryloxy groups, silyl groups, siloxy groups, and deuterated analogs thereof.

Any of the preceding inert matrix polymers can further be deuterated. The level of deuteration can range from 1% to 100%. By "% deuterated" or "% deuteration" is meant the ratio of deuterons to the sum of protons plus deuterons, expressed as a percentage.

In some embodiments, the inert matrix polymer is selected from polystyrene, substituted polystyrene, and deuterated analogs thereof.

The methods to make the inert matrix polymers are well-known in the art. Many such polymers are commercially available.

Any of the above embodiments for the inert matrix polymer can be combined with one or more of the other embodiments, so long as they are not mutually exclusive. For example, the embodiment in which the inert matrix polymer has a hole mobility less than $10^{-6}$ cm$^2$/(s·V) can be combined with the embodiment in which the inert matrix polymer has a triplet energy greater than 2.8 eV. The same is true for the other non-mutually-exclusive embodiments discussed above. The skilled person would understand which embodiments were mutually exclusive and would thus readily be able to determine the combinations of embodiments that are contemplated by the present application.

3. Iridium Complex

The iridium complex is an octahedral complex of Ir(III) having at least one cyclometalating ligand and zero net charge. In some embodiments, at least one cyclometalating ligand is bidentate and forms one 5- or 6-membered ring with the iridium. In some embodiments, at least one cyclometalating ligand is tridentate and forms two 5- or 6-membered rings with the iridium. In some embodiments, at least one cyclometalating ligand is tetradentate and forms three 5- or 6-membered rings with the iridium. In some embodiments, at least one cyclometalating ligand is pentadentate and forms four 5- or 6-membered rings with the iridium. The remaining coordination points on the iridium can be occupied by any other known ligands, so long as the complex has zero net charge. In some embodiments, the iridium complex has the formula where
- L1 is the same or different at each occurrence and is a monoanionic bidentate cyclometalating ligand coordinated through carbon and nitrogen;
- L2 is the same or different at each occurrence and is a monoanionic bidentate ligand which is not coordinated through a carbon;
- L3 is the same or different at each occurrence and is a monodentate ligand;
- a is 1-3;
- b and c are independently 0-2; and
- a, b, and c are selected such that the iridium is hexacoordinate and the complex is electrically neutral.

Some examples of formulae include, but are not limited to, $Ir(L1)_3$; $Ir(L1)_2(L2)$; and $Ir(L1)_2(L3)(L3')$, where L3 is anionic and L3' is nonionic. In some embodiments, the L1 ligand is an aryl-heterocycle. The L1 ligand can have substituents on the aryl portion, the heterocycle portion, or both. The substituents may be selected from the group consisting of F, deuterium, alkyl, fluororalkyl, alkoxyl, alkylamino, arylamino, carbazolyl, CN, silyl, fluoroalkoxyl, aryl, and fluoroalkyl groups. Any of the groups may also be deuterated. The fluorinated derivatives can have one or more fluorine substituents. In some embodiments, there are 1-3 fluorine substituents on the aryl ring of the ligand.

In some embodiments, the aryl group of L1 is phenyl or naphthyl.

In some embodiments, the heterocycle of L1 is an N-heterocycle. In some embodiments, the N-heterocycle is pyridine, quinoline, isoquinoline, diazine, triazine, pyrrole, pyrazole or imidazole.

In some embodiments, the heterocycle of L1 is an S-heterocycle. In some embodiments, the S-heterocycle is thiophene.

Examples of L1 ligands include, but are not limited to phenylpyridines, phenylquinolines, phenylpyrimidines, phenylpyrazoles, thienylpyridines, thienylquinolines, and thienylpyrimidines. As used herein, the term "quinolines" includes "isoquinolines" unless otherwise specified.

Monoanionic bidentate ligands, L2, are well known in the art of metal coordination chemistry. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and phosphinoalkanols (phosphinoalkoxide ligands).

Monodentate ligand L3 can be anionic or nonionic. Anionic ligands include, but are not limited to, $H^-$ ("hydride") and ligands having C, O or S as coordinating atoms. Coordinating groups include, but are not limited to alkoxide, carboxylate, thiocarboxylate, dithiocarboxylate, sulfonate, thiolate, carbamate, dithiocarbamate, thiocarbazone anions, sulfonamide anions, and the like. In some cases, ligands listed above as L2, such as 3-enolates and phosphinoakoxides, can act as monodentate ligands. The monodentate ligand can also be a coordinating anion such as halide, cyanide, isocyanide, nitrate, sulfate, hexahaloantimonate, and the like. These ligands are generally available commercially.

The monodentate L3 ligand can also be a non-ionic ligand, such as CO or a monodentate phosphine ligand.

In some embodiments, one or more of the ligands has at least one substituent selected from the group consisting of F and fluorinated alkyls.

In some embodiments, the iridium complex has a triplet energy greater than 2.6 eV. In some embodiments, the triplet energy is greater than 2.7 eV; in some embodiments, greater than 2.8 eV.

In some embodiments, the iridium complex has a hole mobility greater than $10^{-5}$ cm$^2$/(s·V). In some embodiments, the iridium complex has a hole mobility greater than $10^{-4}$ cm$^2$/(s·V); in some embodiments, greater than $10^{-3}$ cm$^2$/(s·V).

The iridium complexes can be made using standard synthetic techniques as described in, for example, U.S. Pat. No. 6,670,645.

Any of the above embodiments for the iridium complex can be combined with one or more of the other embodiments, so long as they are not mutually exclusive. For example, the embodiment in which the complex has the formula $Ir(L1)_3$ can be combined with the embodiment in which the complex has a triplet energy greater than 2.8 eV. The same is true for the other non-mutually-exclusive embodiments discussed above. The skilled person would understand which embodiments were mutually exclusive and would thus readily be able to determine the combinations of embodiments that are contemplated by the present application.

4. Hole Transport Composition

The concentration of the iridium complex in the hole transport composition is at least 10% by weight, based on the total weight of the composition. In some embodiments, the concentration of the iridium complex in the hole transport composition is 10-90% by weight, based on the total weight of the composition; in some embodiments, 20-80% by weight; in some embodiments 30-70% by weight.

In some embodiments, the hole transport composition is prepared by simply mixing the iridium complex with the inert matrix polymer. This can be done in any liquid medium in which the materials can be dissolved or dispersed at the desired level, and from which a film can be formed. A suitable liquid medium for the compositions described herein can be readily determined by one skilled in the art.

In some embodiments, the liquid medium is a polar non-aqueous solvent. Examples of polar solvents include, but are not limited to, $C_1$ to $C_{20}$ alcohols, ethers, and acid esters.

In some embodiments, the liquid medium is relatively non-polar solvent. Examples of non-polar solvents include, but are not limited to $C_1$ to $C_{12}$ alkanes, aromatics such as toluene, xylenes, trifluorotoluene, and the like.

In some embodiments, the liquid medium is a mixture of two or more solvents.

In some embodiments, the liquid medium is selected from the group consisting of a chlorinated hydrocarbon (such as methylene chloride, chloroform, chlorobenzene), an aromatic hydrocarbon (such as a substituted or non-substituted toluene or xylene, including trifluorotoluene), a polar solvent (such as tetrahydrofuran (THF), N-methyl pyrrolidone (NMP)), an ester (such as ethylacetate, methylbenzoate, or diethylphthalate), an ether (such as anisole or dimethoxybenzene), an alcohol (such as isopropanol), a ketone (such as cyclopentanone), and any mixture thereof.

In some embodiments, the hole transport composition is prepared by adding the iridium complex to the monomer or monomers for the inert matrix polymer and then polymerizing. The polymerization can be carried out under typical conditions for that polymer, so long as the iridium complex is not adversely affected. In some embodiments, the polymerization is initiated by heat and/or radiation.

In some embodiments, the iridium complex is bound to the inert matrix polymer.

In some embodiments, the iridium complex is attached to the inert polymer matrix by covalent bonds between the matrix polymer and at least one ligand on the iridium. Such materials are known and have been described in, for example, U.S. Pat. Nos. 6,869,693, 7,060,372 and 7,090,929.

5. Electronic Device

Organic electronic devices that may benefit from the hole transport composition as described herein include, but are not limited to, (1) devices that convert electrical energy into radiation (e.g., a light-emitting diode, light emitting diode display, lighting device, luminaire, or diode laser); (2) devices that detect signals through electronics processes (e.g., photodetectors, photoconductive cells, photoresistors, photoswitches, phototransistors, phototubes, IR detectors, biosensors); (3) devices that convert radiation into electrical energy, (e.g., a photovoltaic device or solar cell); (4) devices that convert light of one wavelength to light of a longer wavelength, (e.g., a down-converting phosphor device); and (5) devices that include one or more electronic components that include one or more organic semi-conductor layers (e.g., a transistor or diode).

Figure 1:
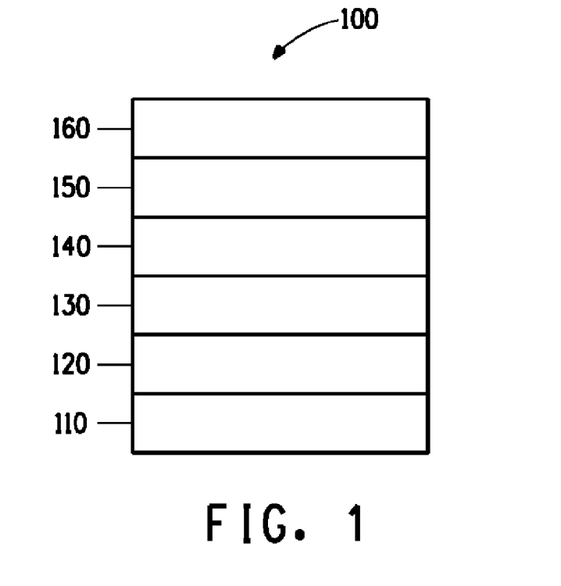
FIG. 1 includes an illustration of one example of an organic electronic device.

A typical device is shown in FIG. 1. and includes an anode 110, a hole injection layer 120, a hole transport layer 130, a photoactive layer 140, an electron transport layer 150, an optional electron injection layer (not shown), and a cathode 160.

In an OLED device, the photoactive layer is a light-emitting layer. The hole transport layer serves to move the injected holes from the anode to the light-emitting layer. The holes then recombine with electrons injected from the cathode to form light-emitting excitons. Since excitons are usually formed near the interface of hole transport layer and light-emitting layer, for maximal efficiency the hole transport material should not quench the luminance of the excitons. For an OLED based on fluorescent emitters, this means that the singlet state of the hole transporting material should be sufficiently higher than the exciton energy. For an OLED based on phosphorescent emitters, the triplet state of the hole transporting material should be sufficiently higher than the exciton energy to avoid quenching. For devices where the light-emitting layer is deposited from solutions, there exists interlayer mixing between the hole transport layer and light light-emitting layer. Under such circumstances, the hole transport material should not degrade the device performance in efficiency and lifetime after being mixed into the light-emitting layer.

Conventional hole transporting materials are based on triarylamines, and include small molecules and polymers. These triarylamine compounds often have a triplet energy lower than or comparable to the emitting exciton energy which causes luminance quenching and reduces device efficiency. Furthermore, for devices where the light-emitting layer is deposited from solution, triarylamine-based hole transport material can be partly mixed into the light-emitting layer which can reduce device lifetime.

The new hole transport compositions described herein comprise a large band-gap, non-hole transporting polymeric material and an iridium complex. Both components have triplet energy equal to or higher than the energy of the emitting exciton, and therefore cannot cause luminance quenching. Furthermore, the mixing of these components into the photoactive layer during solution deposition has minimal effects on the device performance.

Figure 2:
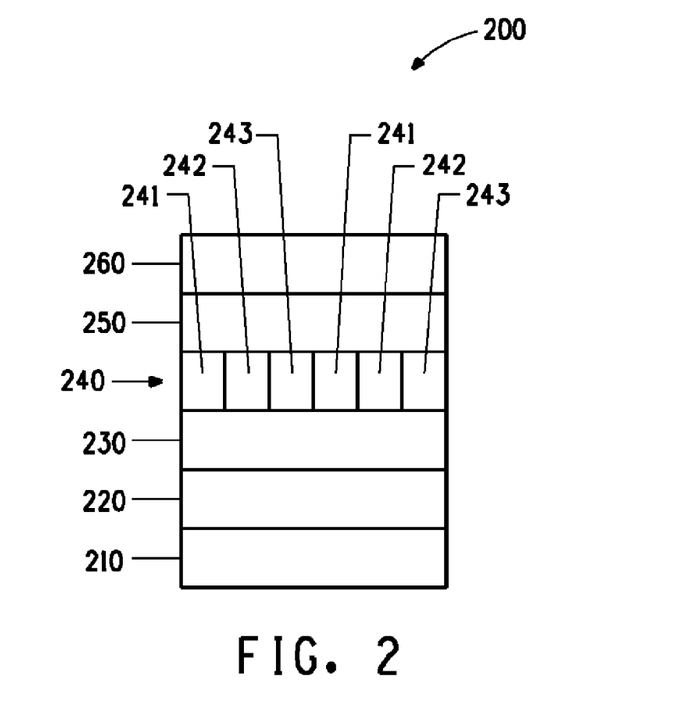
FIG. 2 includes another illustration of an organic electronic device.

In some embodiments, in order to achieve full color, the light-emitting layer is pixellated, with subpixel units for each of the different colors. An illustration of a pixellated device is shown in FIG. 2. The device 200 has anode 210, hole injection layer 220, hole transport layer 230, photoactive layer 240, electron transport layer 250, and cathode 260. The electroluminescent layer is divided into subpixels 241, 242, 243, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in one embodiment 1000-2000 Å; hole injection layer 120, 50-2000 Å, in one embodiment 200-1000 Å; hole transport layer 130, 50-3000 Å, in one embodiment 200-2000 Å; photoactive layer 140, 10-2000 Å, in one embodiment 100-1000 Å; electron transport layer 150, 50-2000 Å, in one embodiment 100-1000 Å; cathode 160, 200-10000 Å, in one embodiment 300-5000 Å. The desired ratio of layer thicknesses will depend on the exact nature of the materials used.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide ("ITO"), are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can comprise charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material. The new hole transport composition described herein is used in this layer. In some embodiments, the hole transport layer includes the new hole transport composition described herein. In some embodiments, the hole transport layer includes only the new hole transport composition described herein, where components that would materially alter the function, the principle of operation, or the distinguishing characteristics of the layer are not present.

Depending upon the application of the device, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Suitable photoactive materials have been discussed above.

In some embodiments, the photoactive layer includes only photoactive material capable of electroluminescence, where components that would materially alter the function, the principle of operation, or the distinguishing characteristics of the layer are not present.

In some embodiments, the photoactive layer includes (a) a host compound and (b) a photoactive dopant capable of electroluminescence having an emission maximum between 380 and 750 nm. In some embodiments, the photoactive layer further includes (c) a second host material. In some embodiments, the composition includes only (a) a first host compound and (b) a photoactive dopant capable of electroluminescence having an emission maximum between 380 and 750 nm, where components that would materially alter the principle of operation or the distinguishing characteristics of the composition are not present. In some embodiments, the composition includes only (a) a first host compound, (b) a photoactive dopant capable of electroluminescence having an emission maximum between 380 and 750 nm, and (c) a second host material, where components that would materially alter the principle of operation or the distinguishing characteristics of the composition are not present.

The amount of photoactive dopant present in the composition is generally in the range of 3-20% by weight, based on the total weight of the composition; in some embodiments, 5-15% by weight. When a second host is present, the ratio of first host to second host is generally in the range of 1:20 to 20:1; in some embodiments, 5:15 to 15:5.

In a single color device, the photoactive dopant is an organometallic light-emitting material.

In a multi-color device, at least one set of subpixels in the photoactive layer includes an organometallic light-emitting material as the photoactive dopant. In some embodiments, two sets of subpixels in the photoactive layer include an organometallic light-emitting material as the photoactive dopant.

In some embodiments, the photoactive dopant is a cyclometalated complex of iridium or platinum. The triplet energy of the photoactive metal complex dopant is the same as or less than the triplet energy of the inert matrix polymer of the hole transport layer. The triplet energy of the photoactive metal complex dopant is the same as or less than the triplet energy of the iridium complex of the hole transport layer.

In some embodiments, the iridium complex in the hole transport layer is the same as the photoactive dopant in the photoactive layer.

In some embodiments, the iridium complex in the hole transport layer is different from the photoactive dopant in the photoactive layer.

Additional electroluminescent ("EL") materials which can be used as a photoactive dopant in multicolor devices, include, but are not limited to, small molecule organic luminescent compounds, conjugated polymers, and mixtures thereof. Examples of small molecule luminescent organic compounds include, but are not limited to, chrysenes, pyrenes, perylenes, rubrenes, coumarins, anthracenes, thiadiazoles, benzofluorenes, derivatives thereof, deuterated analogs thereof, and mixtures thereof. Examples conjugated polymer include, but are not limited to, polyphenylene vinylenes, polyfluorenes, and substituted derivatives thereof.

Examples of red photoactive dopants include, but are not limited to, complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green photoactive dopants include, but are not limited to, complexes of Ir having phenylpyridine ligands, bis(diarylamino)anthracenes, and polyphenylenevinylene polymers. Green light-emitting materials have been disclosed in, for example, published PCT application WO 2007/021117.

Examples of blue photoactive dopants include, but are not limited to, complexes of Ir having phenylpyridine or phenylimidazole ligands, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

Electron transport layer 150 can function both to facilitate electron transport, and also serve as an electron injection layer or confinement layer to prevent quenching of the exciton at layer interfaces. Preferably, this layer promotes electron mobility and reduces exciton quenching.

Examples of electron transport materials which can be used in the electron transport layer 150, include metal chelated oxinoid compounds, including metal quinolate derivatives such as tris(8-hydroxyquinolato)aluminum (AIQ), bis (2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1, 3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof. In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

In some embodiments, each functional layer 110-160, is a single layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device includes the following layer, in order: anode, hole transport layer, photoactive layer, cathode, wherein the hole transport layer includes the new hole transport composition described herein.

In some embodiments, the device includes the following layers, in order: anode, hole injection layer, hole transport layer, photoactive layer, electron transport layer, electron injection layer, cathode, wherein the hole transport layer includes the new hole transport composition described herein.

EXAMPLES

The concepts described herein will be further described in the following examples, which do not limit the scope of the invention described in the claims. Unless otherwise indicated, all percentages are by weight, based on total weight of the composition or layer.

Materials

G-1

G-2

G-3

G-4

$(Ir(ppy)_3)$

-continued

R-1

H-1

(NPB)

H-2

H-3

-continued

H-4

H-5

H-6

(TAPC)

H-7

-continued

Host-1

Host-2: a deuterated indolocarbazole compound.
Host-3=H-7

E-1

E-2: Lithium quinolate ("LiQ")
HIJ-1: an electrically conductive polymer doped with a polymeric fluorinated sulfonic acid.

Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission.

The patterned ITO substrates were cleaned and spin-coated with an aqueous dispersion of a hole injection material (HIJ-1). A hole transport layer was formed by spin-coating a solution of hole transport material in a liquid medium and heated to remove the liquid medium. The workpieces were then spin-coated with a solution of the photoactive layer materials in methyl benzoate and heated to remove solvent. The workpieces were masked and placed in a vacuum chamber. A layer of electron transport material was deposited by thermal evaporation, followed by a layer of electron injection material. Masks were then changed in vacuo and a layer of Al was deposited by thermal evaporation. The chamber was vented, and the devices were encapsulated using a glass lid, desiccant, and UV curable epoxy.

Device Characterization

The OLED samples were characterized by measuring their (1) current-voltage (I-V) curves, (2) electroluminescence luminance versus voltage, and (3) electroluminescence spectra versus voltage. All three measurements were performed at the same time and controlled by a computer. The current efficiency of the device at a certain voltage is determined by dividing the electroluminescence luminance of the LED by the current density needed to run the device. The unit is a cd/A. The color coordinates were determined using either a Minolta CS-100 meter or a Photoresearch PR-705 meter.

Example 1

This example illustrates the effect of adding an inert matrix polymer to the photoactive layer of a device.

The inert matrix polymer was polystyrene with a band gap of 4.4 eV. [Reference: "Handbook of fluorescence spectra of aromatic molecules", I. B. Berlman, Academic Press, New York, 1965, p. 186.] The polystyrene was purchased from Pressure Chemical Co., Mw 400K. It was further re-precipitated from methanol. Purity of the polymer is unknown. The triplet enegy of polystyrene is 3.2 eV. [Reference: George, G. A. & Hodgeman, D. K. C., Europ. Polym. J. 13, 63-71 (1977)]

The device structure is illustrated below. The hole injection, hole transport, and photoactive layers were deposited from solutions, while the electron transport, electron injection, and aluminum layers were deposited by thermal evaporation. The host and device results are given in Table 1.

Device Structure:
Glass substrate
ITO: 50 nm
Hole injection layer: HIJ-1 (50 nm)
Hole transport layer: H-3 (20 nm)
Green photoactive layer: 9% of G-3+91% host, given below (60 nm)
Electron transport layer: ZrQ (10 nm)
Electron injection layer: CsF (1 nm)
Al cathode (100 nm)

TABLE 1

Device performance for Example 1

| Host used | EQE @2000 nits | Voltage @2000 nits | CIE(x, y) | T70@4900 nits, 50° C. |
|---|---|---|---|---|
| Host-1 | 24.3% | 4.82 volt | 0.292, 0.648 | 760 hrs |
| 73% Host-1 + 18% polystyrene | 24.7% | 5.26 volt | 0.294, 0.647 | 670 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As seen from Table 1, the addition of 18% by weight of polystyrene into the photoactive layer has a relatively small effect on both the EQE and lifetime. The EQE remains essentially un-changed. T70 lifetime was reduced only slightly, maintaining 88% of the original lifetime. Further purification of polystyrene may improve this ratio. This example shows that if polystyrene is used as a component in the hole transport layer, some mixing of it into a solution-deposited photoactive layer should not significantly degrade the device performance.

Example 2

This example illustrates the use of the new hole transport composition described herein to form the hole transport layer of a device.

The device structure is illustrated below. The concentration of the iridium complex in the hole transport composition was varied from 18% by weight to 60% by weight. Hole injection and hole transport layers were deposited from solutions, while the photoactive, electron transport, electron injection, and aluminum layers were deposited by thermal evaporation. The device results are given in Table 2.

Device Structure:
Glass substrate
ITO: 50 nm
Hole injection layer: HIJ-1 (50 nm)
Hole transport layer: G3 in polystyrene (20 nm)
Photoactive layer: 14% of G-3+86% of Host-1(60 nm)
Electron transport layer: ZrQ (10 nm)
Electron injection layer: CsF (1 nm)
Al cathode (100 nm)

TABLE 2

Device performance for Example 2

| HTL used | EQE @2000 nits | Voltage @2000 nits | CIE (x, y) | T70@4900 nits, 50° C. |
|---|---|---|---|---|
| 18% G-3 in polystyrene | 16.5% | 7.4 volt | 0.286, 0.656 | 0.75 hrs |
| 30% G-3 in polystyrene | 21.4% | 4.4 volt | 0.309, 0.650 | 965 hrs |
| 50% G-3 in polystyrene | 23.8% | 4 volt | (0.316, 0.646) | 1650 hrs |
| 60% G-3 in polystyrene | 16.5% | 4 volt | (0.328, 0.637) | 800 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 2, high efficiency and long lifetime devices can be made by using Ir compound doped polystyrene as the hole transport layer. Furthermore, the device performance depends on the concentration of the Ir compound. Device performance degrades at both low and high concentrations of Ir compound. While not bounded by theory, at concentrations below the percolation threshold, Ir compounds are not sufficiently interconnected and cannot perform the hole transporting function. At very high concentrations, aggregates of Ir compounds may form which may trap holes and degrade device performance. There exists an optimal region in the middle which gives the best performance.

Example 3

This example illustrates the use of the new hole transport composition described herein to form the hole transport layer of a device.

The device structure is illustrated below. Hole injection, hole transport, and photoactive layers were deposited from solutions, while the electron transport, electron injection, and aluminum layers were deposited by thermal evaporation. The device results are given in Table 3.

Device Structure:
Glass substrate
ITO: 50 nm
Hole injection layer: HIJ-1 (50 nm)
Hole transport layer: H3 or G3 in polystyrene (20 nm)
Photoactive layer: 9% of G-3+91% of Host-1(60 nm)
Electron transport layer: E1 (10 nm)
Electron injection layer: E2 (3.5 nm)
Al cathode (100 nm)

TABLE 3

Device performance for Example 3

| HTL used | EQE @2000 nits | Voltage @2000 nits | CIE (x, y) | T70@4900 nits, 50° C. |
|---|---|---|---|---|
| H-3 | 24% | 4 volt | (0.318, 0.634) | 400 hrs |
| 50% G-3 in polystyrene | 10% | 4.8 volt | (0.312, 0.636) | 725 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 3, T70 lifetime of device made with G-3 doped polystyrene hole transport layer is longer than device made with triarylamine based polymeric hole transport layer, H-3.

Example 4

This example illustrates the use of the new hole transport composition described herein to form the hole transport layer of a device.

The device structure is illustrated below. Hole injection, hole transport, and photoactive layers were deposited from solutions, while the electron transport, electron injection, and aluminum layers were deposited by thermal evaporation. The device results are given in Table 4.

Device Structure:
Glass substrate
ITO: 50 nm
Hole injection layer: HIJ-1 (50 nm)
Hole transport layer: H3 or G3 in polystyrene (20 nm)
Photoactive layer: 9% of G-3+45.5% of Host-1+45.5% of Host-3 (60 nm)
Electron transport layer: E1 (10 nm)
Electron injection layer: E2 (3.5 nm)
Al cathode (100 nm)

TABLE 4

Device performance for Example 4

| HTL used | EQE @2000 nits | Voltage @2000 nits | CIE (x, y) | T70@4900 nits, 50° C. |
|---|---|---|---|---|
| H-3 | 24.4% | 4.9 volt | (0.305, 0.64) | 600 hrs |
| 50% G-3 in polystyrene | 17% | 5.4 volt | (0.311, 0.637) | 800 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 4, T70 lifetime of device made with G-3 doped polystyrene hole transport layer is longer than device made with triarylamine based polymeric hole transport layer, H-3.

Example 5

This example illustrates the use of the new hole transport composition described herein to form the hole transport layer of a device.

The device structure is illustrated below. Hole injection, hole transport, and photoactive layers were deposited from solutions, while the electron transport, electron injection, and aluminum layers were deposited by thermal evaporation. The device results are given in Table 5.

Device Structure:
Glass substrate
ITO: 50 nm
Hole injection layer: HIJ-1 (50 nm)
Hole transport layer: H3 or G-4 in polystyrene (20 nm)
Photoactive layer: 9% of G-3+45.5% of Host-1+45.5% of Host-3 (60 nm)
Electron transport layer: E1 (10 nm)
Electron injection layer: E2 (3.5 nm)
Al cathode (100 nm)

TABLE 5

Device performance for Example 5

| HTL used | EQE @2000 nits | Voltage @2000 nits | CIE (x, y) | T70@ 5 mA/cm2, 50° C. |
|---|---|---|---|---|
| H-3 | 25% | 4.7 volt | (0.312, 0.638) | 745 hrs |
| 30% G-4 in polystyrene | 19.6% | 5.2 volt | (0.304, 0.641) | 1100 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 5, T70 lifetime of the device made with G-4 doped polystyrene as a hole transport layer is longer than device made with a triarylamine-based polymeric hole transport layer, H-3.

It should be further noted that the device structures used in the above examples are optimized for H-3 as the hole transport layer. With the hole transport material disclosed in this invention, the device structure needs to be re-optimized to achieve maximal device efficiency. This may be done by tuning the hole injection layer, electron transport layer, or the host composition. In any event, the enhancement of device lifetime with the examples of the present invention is clearly demonstrated by the above examples.

Comparative Example A

This example illustrates the decrease in luminance when arylamino materials are present in the photoactive layer.

A green emitter, either G-1 or G-2, was dissolved in toluene, and its concentration was adjusted such that the optical density of the absorption spectrum at the excitation wavelength, 450 nm, was below 0.5. The solution was degassed by repeated freeze-pump-and-thaw method to remove the air. The luminance spectrum of this solution was then recorded. The hole transport material, either NPB or H1301, was then added to the solution and its effect on the luminance spectrum recorded. During this experiment, the concentration of the green emitter was maintained at the same concentration. The quenching effects of adding hole transport material to the luminance intensity of the green emitter are illustrated in FIG. 3 and FIG. 4.

Figure 3:
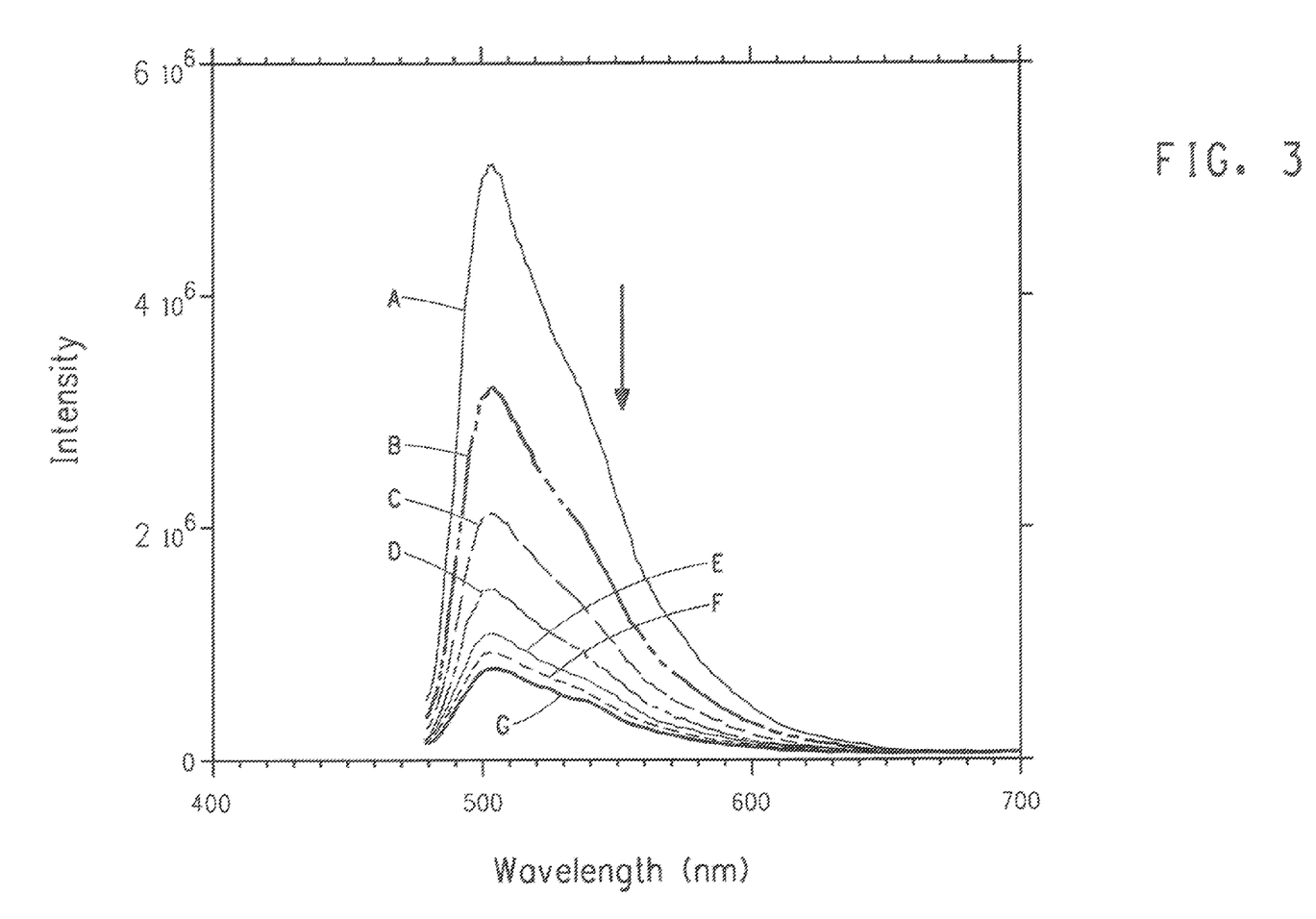
FIG. 3 includes a graph of spectra showing luminescence quenching.

FIG. 3 shows the luminance spectra when G-1 is used as the photoactive material and increasing amounts of H-1 are added. Lines A-G are the spectra for idifferent concentrations of H-1. The arrow indicates increasing H-1 concentration from zero in line A, to 0.003 M in line G. The luminance decreases dramatically as the concentration of H-1 increases.

Figure 4:
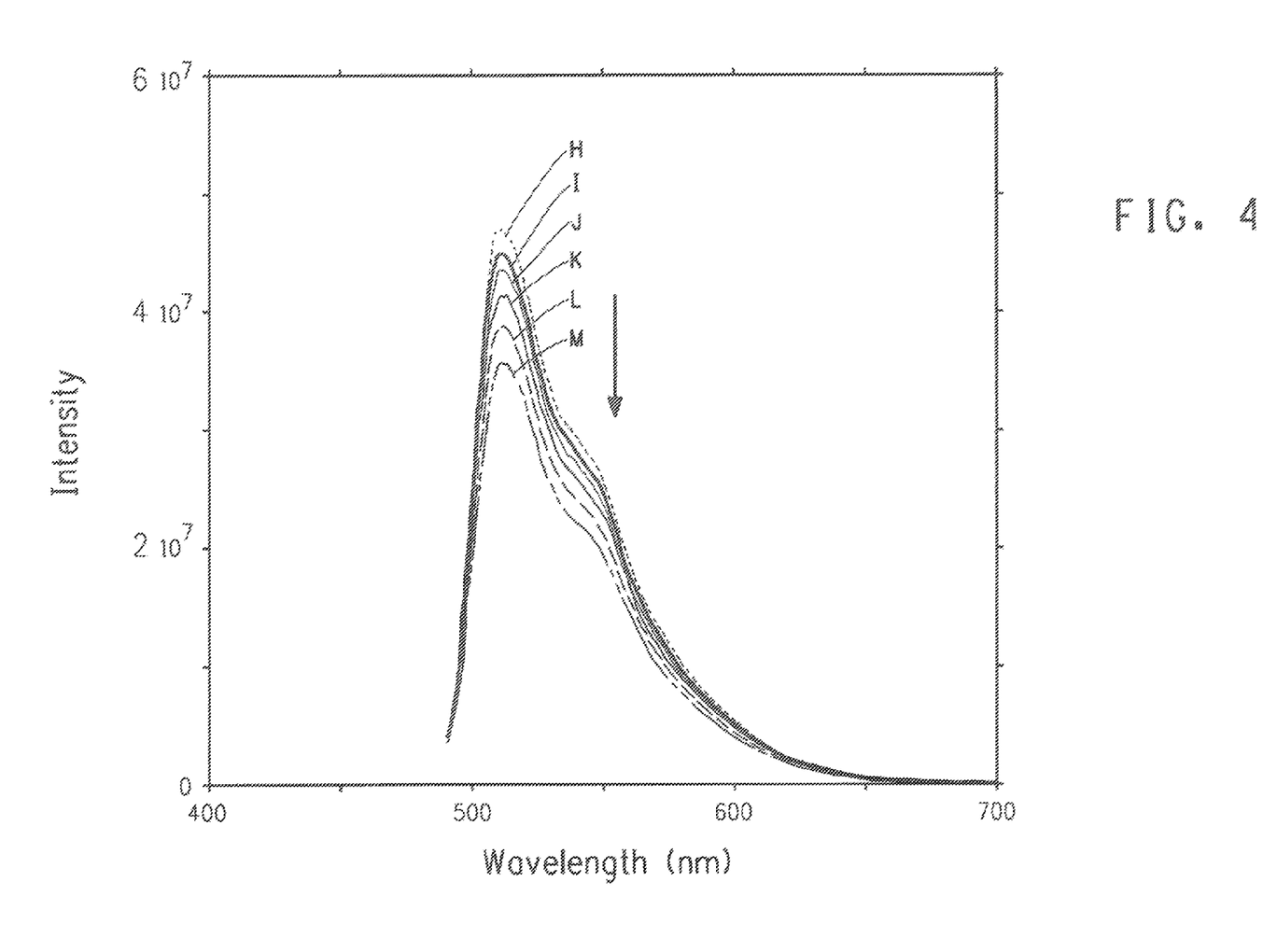
FIG. 4 includes a graph of spectra showing luminescence quenching.

FIG. 4 shows the luminance spectra when G-2 is used as the photoactive material and increasing amounts of H-2 are added. Lines H-M are the spectra for different concentrations of H-2. The arrow indicates increasing H-2 concentration from zero in line H, to 0.0012 M in line M. The luminance decreases dramatically as the concentration of H-2 increases.

These experiments illustrate that conventional hole transport materials, such as H-1 or H-2, are capable of quenching the luminance of green iridium complex emitters. This is due to the fact that hole transport materials based on triarylamine moieties have relatively low triplet energy. In the new hole transport composition described herein, one component of the hole transport composition is an iridium complex with exciton energy equal to or higher than the energy of the emitting exciton in the photoactive layer. The other component is an inert matrix polymer having a large band gap and a triplet energy higher than the emitting exciton Neither component is capable of quenching the luminance of the emitting excitons.

Comparative Example B

This example illustrates the reduction in lifetime when an arylamine-based hole transport material is mixed into the photoactive layer.

This example studied the effects on lifetime when H-4 is added into the photoactive layer of a green device. The H-4 has a high triplet energy and does not quench the green luminance. The device structure is illustrated below. The hole injection, hole transport, and photoactive layer s were deposited from solution, while the electron transport, electron injection, and aluminum layers were deposited by thermal evaporation. The host composition and device performance are given in Table 6.

Device Structure:
Glass substrate
ITO: 50 nm
Hole injection layer: HIJ-1 (50 nm)
Hole transport layer: H-3 (20 nm)
Photoactive layer: 9% G-3+91% host
Electron transport layer: ZrQ (10 nm)
Electron injection layer: CsF (1 nm)
Al cathode (100 nm)

TABLE 6

Device performance for Comparative Example B

| Host used | EQE @2000 nits | Voltage @2000 nits | CIE (x, y) | T70@2xDisplay Luminance, 50° C. |
|---|---|---|---|---|
| Host-1 | 22.7% | 5.1 volt | 0.304, 0.641 | 900 hrs |
| 73% Host-1 + 18% H-4 | 22.6% | 4.9 volt | 0.305, 0.64 | 340 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As seen from Table 6, the addition of 18% by weight of H-4 into the photoactive layer has a relatively small effect on the EQE, but the T70 lifetime was reduced to about 38% of the original lifetime. For devices where the photoactive layer was deposited from solution, triarylamine-based material from the hole transport layer was frequently mixed into the photoactive layer which can result in a reduction in lifetime.

Comparative Example C

This example illustrates the reduction in device lifetime when an arylamine-based hole transport material is mixed into the photoactive layer.

In this example, triarylamine-based H-5 is added to the photoactive layer of a green device. The H-5 has a high triplet energy and will not quench the green luminance. The device structure is given below. The hole injection, hole transport, and photoactive layers were deposited from solutions, while the electron transport, electron injection, and aluminum layers were deposited by thermal evaporation. The host composition and device performance are given in Table 7.

Device Structure:
Glass substrate
ITO: 50 nm
Hole injection layer: HIJ-1 (50 nm)
Hole transport layer: H-3 (20 nm)
Photoactive layer: 9% of G-3+91% host
Electron transport layer: ZrQ (10 nm)
Electron injection layer: CsF (1 nm)
Al cathode (100 nm)

TABLE 7

Device performance for Comparative Example C

| Host used | EQE@ 2000 nits | Voltage @2000 nits | CIE (x, y) | T70@2xDisplay Luminance, 50 C. |
|---|---|---|---|---|
| Host-1 | 25% | 5 volt | 0.305, 0.641 | 980 hrs |
| 73% Host-1 + 18% H-5 | 22.7% | 5.1 volt | 0.301, 0.643 | 314 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As seen from Table 7, the addition of 18% by weight of H-5 into the photoactive layer reduced EQE slightly, but the T70 lifetime was reduced to about 32% of the original lifetime. For devices where the photoactive layer was deposited from solution, triarylamine-based hole transport material from the hole transport layer was frequently mixed into the photoactive layer, which could result in a reduction in lifetime.

Comparative Example D

This example device performance when an iridium complex is used alone as the hole transport material.

Devices with the structures below were fabricated with and without the use of a second hole transport layer consisting of 5 nm G-3. Hole injection and first hole transport layers were deposited from solution, while the second hole transport, emissive, electron transport, electron injection, and aluminum layers were deposited by thermal evaporation. The device results are given in Table 8 below.

Device Structure:
Glass substrate
ITO: 50 nm
Hole injection layer: HIJ-1 (50 nm)
First hole transport layer: 30% G3 in polystyrene (20 nm)
Second hole transport layer: shown in table below
Photoactive layer: 14% of G-3+86% of Host-1 (60 nm)
Electron transport layer: ZrQ (10 nm)
Electron injection layer: CsF (1 nm)
Al cathode (100 nm)

TABLE 8

Device performance for Comparative Example D

| Second HTL | EQE @2000 nits | Voltage @2000 nits | CIE (x, y) | T70@2xDisplay Luminance, 50 C. |
|---|---|---|---|---|
| none | 23.8% | 4.4 volt | 0.309, 0.65 | 965 hrs |
| 5 nm G-3 | 2.4% | 7.2 volt | 0.357, 0.617 | 17 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 8, the use of a second hole transport layer consisting of 5 nm G-3 dramatically reduced the device efficiency and lifetime.

Comparative Example E

This example demonstrates that the device performance using an iridium complex as the hole transport layer Devices with the structure below were fabricated with the hole transport layer ("HTL") of either H-6 or G-3. The hole injection layer was deposited from solutions, while the hole transport, photoactive, electron transport, electron injection, and aluminum layers were deposited by thermal evaporation. The HTL composition and device performance are given in Table 9 below.

Device Structure:
Glass substrate
ITO: 50 nm
Hole injection layer: HIJ-1 (50 nm)
Hole transport layer: shown below (20 nm)
Photoactive layer: 14% of G-3+86% of Host-2 (52 nm)
Electron transport layer: ZrQ (10 nm)
Electron injection layer: CsF (1 nm)
Al cathode (100 nm)

TABLE 9

Device performance for Comparative Example E

| HTL | EQE @2000 nits | Voltage @2000 nits | CIE (x, y) | T70@2xDisplay Luminance, 50 C. |
|---|---|---|---|---|
| H-6 | 17% | 3.4 volt | 0.337, 0.634 | 1000 hrs |
| G-3 | 1.6% | 5.5 volt | 0.355, 0.619 | — |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 9, the use of G-3 as the HTL drastically reduced the efficiency of the device.

Comparative Example F

This example illustrates the effect of adding an iridium complex to a hole transport material in the hole transport layer of a device.

Arylamine-based H-6 was used as the hole transport compound. Devices were made using H-6 as HTL, with and without G-3. The device structure is shown below. The hole injection layer was deposited from solution, while the hole transport, emissive, electron transport, electron injection, and aluminum layers were deposited by thermal evaporation.
Device Structure:
Glass substrate
ITO: 50 nm
Hole injection layer: HIJ-1 (50 nm)
Hole transport layer: G3 in H-6 (20 nm)
Photoactive layer: 14% of G-3+86% of Host-1(52 nm)
Electron transport layer: ZrQ (10 nm)
Electron injection layer: CsF (1 nm)
Al cathode (100 nm)

TABLE 10

Device performance for Comparative Example F

| HTL used | EQE @2000 nits | Voltage @2000 nits | CIE (x, y) | T70 @16,000 nits |
|---|---|---|---|---|
| H-6 | 17% | 3.4 volt | 0.337, 0.634 | 1000 hrs |
| 20% G3 in H-6 | 22.8% | 3.9 volt | 0.328, 0.64 | 250 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 10, while the addition of the Ir compound, G-3, into the HTL of H-6, improved device efficiency, it drastically reduced device lifetime. The inert matrix polymer having a large band gap of the new hole transport composition described herein, provides a more stable matrix than a hole transporting compound.

Comparative Example G

This example illustrates the effect of adding an iridium complex to a hole transport polymer in the HTL of a device.

Devices were made using H-3 as the HTL, with and without G-3. The device structure is shown below. The hole injection, hole transport, and photoactive layers were deposited from solution, while the electron transport, electron injection, and aluminum layers were deposited by thermal evaporation. HTL compositions and device results are given in Table 11 below.
Device Structure:
Glass substrate
ITO: 50 nm
Hole injection layer: HIJ-1 (50 nm)
Hole transport layer: shown in the table (20 nm)
Photoactive layer: 9% of G-3+91% of Host-1 (60 nm)
Electron transport layer: ZrQ (10 nm)
Electron injection layer: CsF (1 nm)
Al cathode (100 nm)

TABLE 11

Device performance for Comparative Example G

| HTL | EQE @2000 nits | Voltage @2000 nits | CIE (x, y) | T70 @16,000 nits |
|---|---|---|---|---|
| H-3 | 22.6 | 4.3 | 0.332, 0.663 | 325 hrs |
| 10% G3 in H-3 | 16% | 5.9 | 0.3, 0.649 | shorted |
| 20% G3 in H-3 | 8.4 | 5.9 | 0.317, 0.641 | 130 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

As can be seen from Table 11, the addition of Ir compound, G-3, into the hole transporting polymer, H-3, actually degraded both the efficiency and lifetime of the devices. The large bandgap, non-hole transporting polymer used in this invention provides a more stable matrix than a hole transporting polymer.

Comparative Example H

This example illustrates the effect of adding an organic hole transport compound into an inert matrix polymer having a large band gap.

H-7 was used as the hole transporting molecule and polystyrene was used as the inert matrix polymer. The device structure is shown below. The hole injection and H-7 in polystyrene layers were deposited from solutions, while the H-7, photoactive, electron transport, electron injection, and aluminum layers were deposited by thermal evaporation. HTL compositions and device results are given in Table 12 below.
Device Structure:
Glass substrate
ITO: 50 nm
Hole injection layer: HIJ-1 (50 nm)
Hole transport layer: shown below (20 nm)
Photoactive layer: 16% of G-3+84% of Host-1 (58 nm)
Electron transport layer: ZrQ (10 nm)
Electron injection layer: CsF (1 nm)
Al cathode (100 nm)

TABLE 12

Device results for Comparative Example H

| HTL | EQE @2000 nits | Voltage @2000 nits | CIE (x, y) | T70 @2xdisplay luminance, 50 C. |
|---|---|---|---|---|
| H-7 | 28% | 3.2 V | 0.295, 0.656 | 1060 hrs |
| 50% H-7 in polystyrene | 20.7% | 5.1 volt | 0.328, 0.638 | 140 hrs |

E.Q.E. is the external quantum efficiency; CIE(x, y) are the x and y color coordinates according to the C.I.E. chromaticity scale (Commission Internationale de L'Eclairage, 1931); T70 is a measure of lifetime and is the time to reach 70% of initial luminance.

It can be seen from Table 12 that 50% H-7 doped polystyrene HTL reduced both the efficiency and lifetime of the device compared to devices made of H-7 as HTL. When used in combination with large bandgap inert matrix polymers, Ir compounds are preferred over organic hole-transporting small molecules.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A hole transport composition comprising (a) an inert matrix polymer and (b) at least 10% by weight, based on the total weight of the composition, of a cyclometalated iridium complex; wherein the hole transport composition does not cause luminance quenching.

2. The hole transport composition of claim 1, wherein the inert matrix polymer has a hole mobility less than $10^{-6}$ cm$^2$/(s·V).

3. The hole transport composition of claim 1, wherein the inert matrix polymer has a band gap greater than 2.8 eV.

4. The hole transport composition of claim 1, wherein the inert matrix polymer has a first triplet energy greater than 2.6 eV.

5. The hole transport composition of claim 1, wherein the inert matrix polymer has a local dipole moment less than 5 debye.

6. The hole transport composition of claim 1, wherein the inert matrix polymer is selected from the group consisting of polystyrenes, polycarbonates, polydienes, polyakylacrylates, polyolefins, polysiloxanes, fluoropolymers, polytetrafluoroethylenes, polyvinylidene fluorides, poly(ethylene glycol), poly(ethylene oxide), their co-polymers, substituted derivatives, and deuterated analogs thereof.

7. The hole transport composition of claim 1, wherein the inert matrix polymer is selected from the group consisting of polystyrenes, substituted polystyrenes, and deuterated analogs thereof.

8. The hole transport composition of claim 1, wherein the concentration of the cyclometalated iridium complex is 20-80% by weight, based on the total weight of the composition.

9. The hole transport composition of claim 1, wherein the concentration of the cyclometalated iridium complex is 30-70% by weight, based on the total weight of the composition.

10. The hole transport composition of claim 1, wherein the cyclometalated iridium complex has the formula Ir(L1)a(L2)b(L3)c;

where

L1 is the same or different at each occurrence and is a monoanionic bidentate cyclometalating ligand coordinated through carbon and nitrogen;

L2 is the same or different at each occurrence and is a monoanionic bidentate ligand which is not coordinated through a carbon;

L3 is the same or different at each occurrence and is a monodentate ligand;

a is 1-3;

b and c are independently 0-2; and a, b, and c are selected such that the iridium is hexacoordinate and the complex is electrically neutral.

11. The hole transport composition of claim 1, wherein the cyclometalated iridium complex is mixed with the inert matrix polymer.

12. The hole transport composition of claim 1, wherein the cyclometalated iridium complex is bound to the inert matrix polymer by covalent bonds.

13. An electronic device comprising, in order, anode, hole transport layer, photoactive layer, cathode, wherein the hole transport layer comprises: (a) an inert matrix polymer and (b) at least 10% by weight, based on the total weight of the composition, of a cyclometalated iridium complex; and wherein the hole transport layer does not cause luminance quenching.

14. The electronic device of claim 13, wherein the hole transport layer consists essentially of: (a) an inert matrix polymer and (b) at least 10% by weight, based on the total weight of the composition, of a cyclometalated iridium complex.

15. The hole transport composition of claim 1, wherein the inert polymer matrix is deuterated.

* * * * *